(12) United States Patent
Sankman et al.

(10) Patent No.: US 10,304,769 B2
(45) Date of Patent: May 28, 2019

(54) MULTI-DIE PACKAGE

(71) Applicant: INTEL CORPORATION, Santa Clara, CA (US)

(72) Inventors: Robert L. Sankman, Phoenix, AZ (US); Allan A. Ovrom, III, San Jose, CA (US); Robert Starkston, Phoenix, AZ (US); Oren Arad, Palo Alto, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/748,106

(22) PCT Filed: Aug. 27, 2015

(86) PCT No.: PCT/US2015/047291
§ 371 (c)(1),
(2) Date: Jan. 26, 2018

(87) PCT Pub. No.: WO2017/034589
PCT Pub. Date: Mar. 2, 2017

(65) Prior Publication Data
US 2018/0226334 A1    Aug. 9, 2018

(51) Int. Cl.
*H01L 23/52* (2006.01)
*H01L 23/498* (2006.01)
(Continued)

(52) U.S. Cl.
CPC .. *H01L 23/49894* (2013.01); *H01L 23/49816* (2013.01); *H01L 23/5383* (2013.01); *H01L 24/00* (2013.01); *H01L 24/19* (2013.01); *H01L 2224/04105* (2013.01); *H01L 2224/12105* (2013.01); *H01L 2224/32225* (2013.01); *H01L 2224/73253* (2013.01); *H01L 2224/73267* (2013.01); *H01L 2224/92244* (2013.01)

(58) Field of Classification Search
CPC ... H01L 24/00; H01L 23/49816; H01L 24/19; H01L 23/5383; H01L 23/49894
USPC ......................................................... 257/738
See application file for complete search history.

(56) References Cited

U.S. PATENT DOCUMENTS 8,188,593 B2 *  5/2012  Chen ..................... H01L 23/147
                                                257/712
8,975,726 B2 *  3/2015  Chen ....................... H01L 24/83
                                                257/532
(Continued)

FOREIGN PATENT DOCUMENTS

CN        103311192 A        12/2013

OTHER PUBLICATIONS

International Search Report and Written Opinion dated May 25, 2016 for International Application No. PCT/US2015/047291, 12 pages.

*Primary Examiner* — Luan C Thai
(74) *Attorney, Agent, or Firm* — Schwabe, Williamson & Wyatt, P.C.

(57) ABSTRACT

Embodiments herein may relate to a package that includes a package substrate with a first die on a first side of the package substrate and a second die on a second side of the package substrate. Solder balls may be coupled with the second side of the package substrate and the second die such that the solder balls are approximately coplanar. Other embodiments may be described and/or claimed.

17 Claims, 11 Drawing Sheets

(51) Int. Cl.
    *H01L 23/538*    (2006.01)
    *H01L 23/00*     (2006.01)

(56) References Cited

U.S. PATENT DOCUMENTS

| | | | |
|---|---|---|---|
| 9,142,478 B2* | 9/2015 | Kim | H01L 23/36 |
| 9,362,140 B2* | 6/2016 | Hu | H01L 21/56 |
| 9,633,974 B2* | 4/2017 | Zhai | H01L 25/0652 |
| 9,653,445 B2* | 5/2017 | Lin | H01L 22/20 |
| 2009/0200651 A1 | 8/2009 | Kung et al. | |
| 2010/0320591 A1 | 12/2010 | Camacho et al. | |
| 2014/0138816 A1 | 5/2014 | Lu et al. | |
| 2014/0327129 A1* | 11/2014 | Cho | H01L 23/552 |
| | | | 257/713 |

* cited by examiner

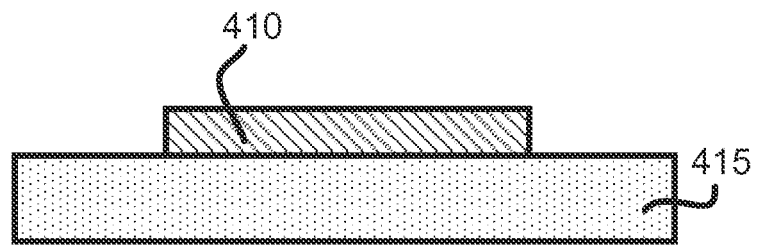
Figure 4-A
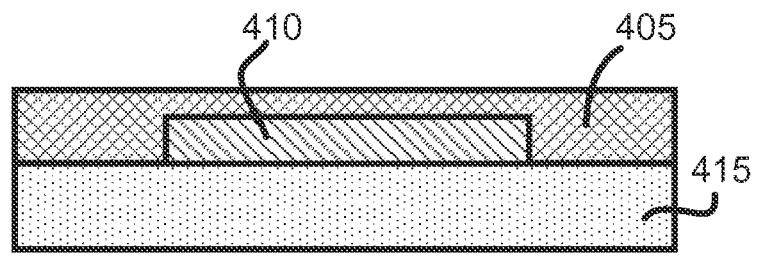
Figure 4-B
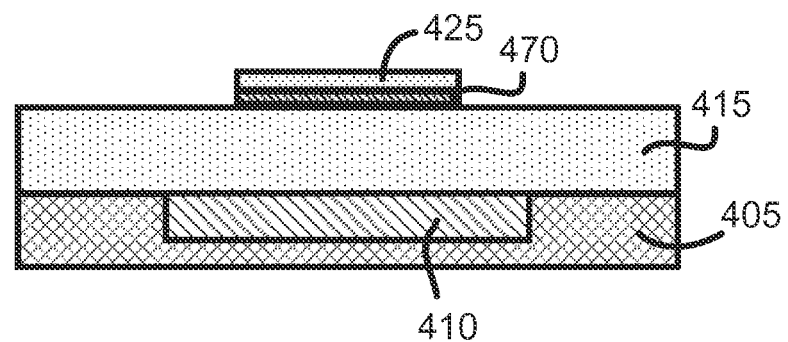
Figure 4-C

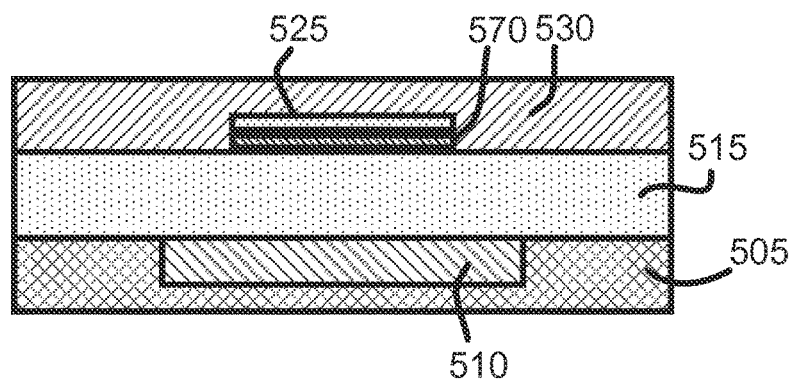
Figure 5-A
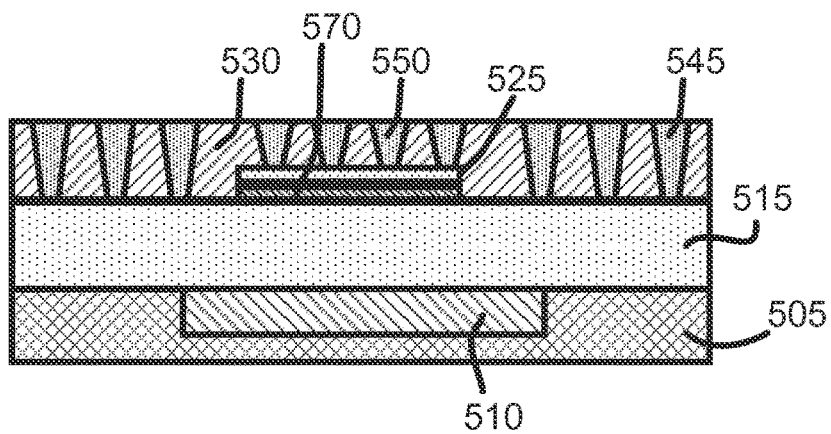
Figure 5-B
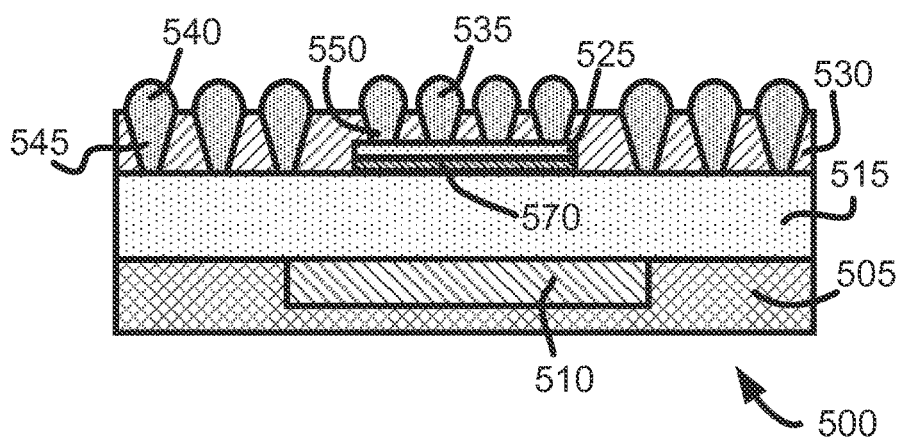
Figure 5-C

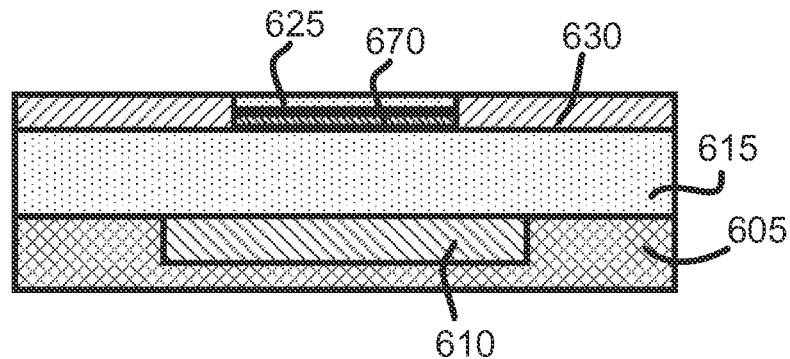
Figure 6-A
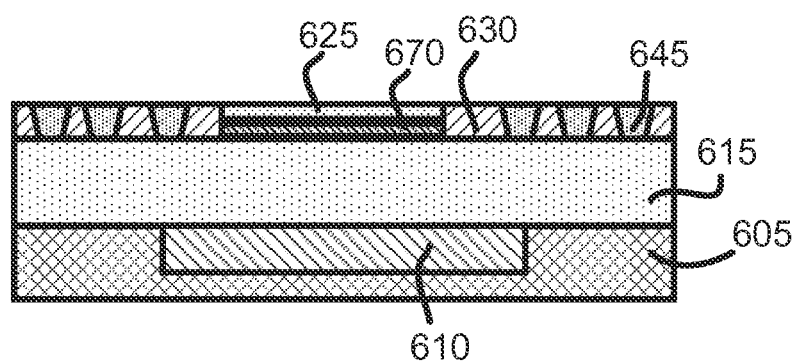
Figure 6-B
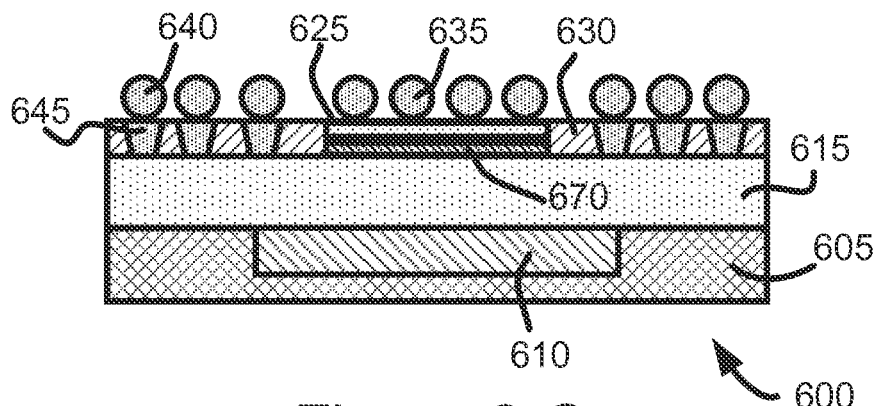
Figure 6-C

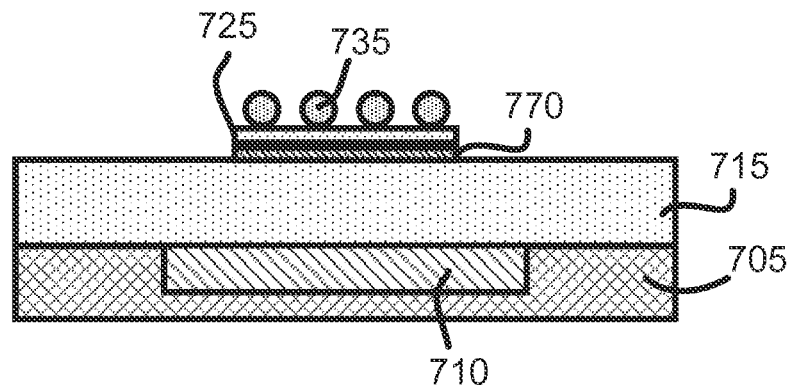
Figure 7-A
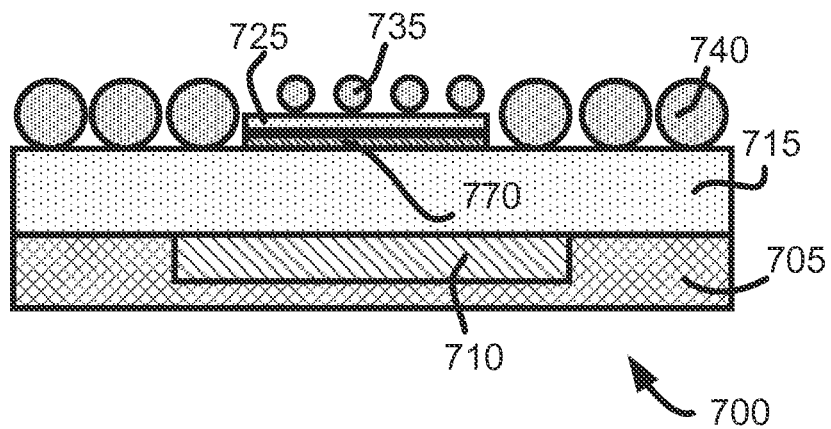
Figure 7-B

MULTI-DIE PACKAGE

CROSS REFERENCE TO RELATED APPLICATIONS

The present application is a national phase entry under 35 U.S.C. § 371 of International Application No. PCT/US2015/047291, filed Aug. 27, 2015, entitled "MULTI-DIE PACKAGE", which designated, among the various States, the United States of America. The Specifications of the PCT/US2015/047291 Application is hereby incorporated by reference.

TECHNICAL FIELD

The present disclosure relates generally to the field of integrated circuit (IC) packages, and more particularly to the field of multi-die IC packages.

BACKGROUND in certain applications, for example, electronic devices such as wearable or mobile devices, the size of the electronic device may be an important factor in design considerations of the electronic device. For example, it may be desirable for the electronic device to have a small footprint or a relatively low z-height. These considerations may further drive form factor considerations for IC packages in the electronic device. As an example, the footprint of multi-chip or multi-die packages (collectively referred to herein as multi-die packages) may be an important element in enabling the relatively small form factor of the electronic device.

A further consideration may be the cost of the multi-die packages used by the electronic device. For example, component cost may be a significant driver of the cost of the electronic device. Therefore, it may be desirable for the electronic device to use relatively low-cost multi-die packages.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4-A, 4-B, and 4-C are a simplified cross-sectional view of various stages of manufacturing the multi-die package of FIG. 1, 2, or 3, in accordance with various embodiments.

FIGS. 5-A, 5-B, and 5-C are a simplified cross-sectional view of various stages of manufacturing the multi-die package of FIG. 1, in accordance with various embodiments.

FIGS. 6-A, 6-B, and 6-C are a simplified cross-sectional view of various stages of manufacturing the multi-die package of FIG. 2, in accordance with various embodiments.

FIGS. 7-A and 7-B are a simplified cross-sectional view of various stages of manufacturing the multi-die package of FIG. 3, in accordance with various embodiments.

DETAILED DESCRIPTION

Figure 1:
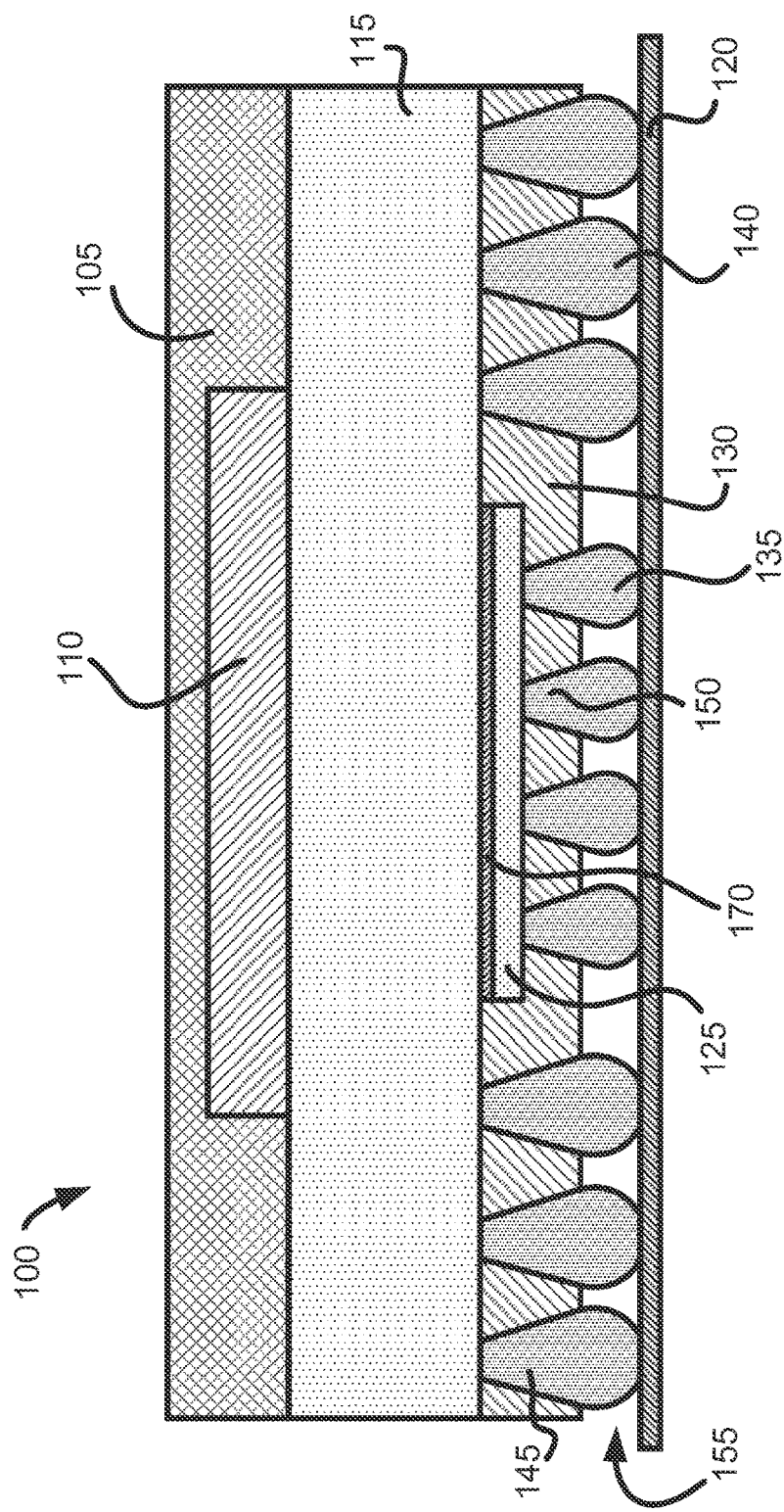
FIG. 1 is a simplified cross-sectional view of one embodiment of a multi-die package, in accordance with various embodiments.

Embodiments herein may relate to a package that includes a package substrate with a first die on a first side of the package substrate and a second die on a second side of the package substrate. Solder balls may be coupled with the second side of the package substrate and the second die such that the solder balls are approximately coplanar.

In some embodiments, the solder balls may be coupled with the package substrate and the second die via conductive through mold interconnects in a mold. In some embodiments, first solder balls may be coupled with the package substrate via a through mold interconnect in a mold, and second solder balls may be coupled directly with the second die. In these embodiments, the solder balls may have a generally similar diameter to one another.

In other embodiments, first solder balls may be coupled directly with the package substrate and second solder balls may be coupled directly with the second die. In these embodiments, the diameter of the first solder balls may be greater than the diameter of the second solder balls.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 depicts an example multi-die package 100 in accordance with various embodiments herein. In embodiments, the package 100 may include a first die 110 and a second die 125 mounted on opposite sides of a package substrate 115. In embodiments, the first and/or second die 110 and/or 125 may be a processor, a memory, a system on a chip (SOC), a power management integrated circuit (PMIC), a memory SOC, or some other digital and/or analog IC. Generally, the first and/or second die 110 and/or 125 may be a silicon chip with multiple electrical interconnects that utilizes solder joints to facilitate a connection from the chip to a substrate. In some embodiments, the die 110 and/or 125 may be a semiconductor integrated circuit—analog, digital, or for examples a microelectricalmechanical system (MEMS) device. Additionally, in some embodiments the die 125 may be coupled with the package substrate 115 via an adhesive layer 170. In embodiments, the adhesive layer 170 may be or may include epoxy based composite materials. For example, the adhesive layer 170 may be or may include an organic adhesive such as epoxy mixed with fillers that are selected based at least in part on desired electrical, thermal, and/or mechanical properties. Examples of such an adhesive may include a silica filled and/or silver filled epoxy adhesive.

In some embodiments, the second die 125 may be encapsulated by a mold 130. In embodiments, the mold 130 may be an epoxy material or some other type of relatively electrically and/or thermally neutral dielectric material. For example, in some embodiments the mold 130 may be or may include epoxy materials with specially formulated filler particles to adulterate the mechanical properties of the combined epoxy +filler composite material.

In embodiments, the mold may include a number of through mold interconnects. Specifically, the mold 130 may include one or more substrate through mold interconnects 145 and one or more die through mold interconnects 150. In embodiments, the substrate through mold interconnects 145 and/or die through mold interconnects 150 may be formed by an ablation process using a laser based drilling tool, followed by a solder or alternative conductive material filling process to make an electrical connection through the interconnects 145 and/or 150. An alternative description of the process may be a process that includes laser ablation, cleaning, and then solder paste deposition and reflow.

As can be seen in FIG. 1, a substrate through mold interconnect 145 may generally connect a solder ball 140 external to the mold 130 to the package substrate 115. Similarly, the die through mold interconnects) 150 may generally connect a solder ball 135 external to the mold 130 to the die 125. The solder balls 140 and 135 may be generally arranged in a ball grid array (BGA) in some embodiments, while in other embodiments the solder balls 140 and/or 135 may be arranged in an alternative pattern or formation. As shown in FIG. 1, the diameters of solder balls 140 and 135 may be approximately equivalent to one another.

As discussed herein, the through mold interconnect(s) 145 and 150 may be conductive. That is, they may be filled with a conductive material that is configured to transfer electrical signals between the solder balls 135/140 and the die 125 or package substrate 115. Additionally, although the through mold interconnect(s) 145 and 150 may be described as coupled with the package substrate 115 and/or die 125, respectively, it will be recognized that the through mold interconnect(s) 145 and/or 150, and particularly the conductive elements of the through mold interconnect(s) 145 and/or 150, may be coupled with an electrode or other conductive element of the package substrate 115 and/or die 125. The electrode(s) are not shown herein for the sake of clarity.

Although only a single substrate through mold interconnect 145, a single solder ball 135, a single die through mold interconnect 150, and a single solder ball 140 are labeled in FIG. 1, it will be understood that not labeling every element of FIG. 1 is for the sake of clarity and readability. Although not every element is labeled, FIG. 1 may be interpreted to depict a total of six substrate through mold interconnects 145, respectively coupled with solder balls 140. Similarly, FIG. 1 may be interpreted to depict a total of four die through mold interconnects 150, respectively coupled with solder balls 135. The number and precise arrangement of the solder balls 135/140 or through mold interconnects 145/150 may vary in other embodiments and be greater or smaller than the number depicted in FIG. 1. Additionally it will be understood that FIG. 1 is intended to represent a cross-section of a three dimensional structure, and in other embodiments there may be additional rows of interconnects and solder balls behind and/or in front of the plane of FIG. 1.

The solder balls 135 and 140 may be collectively referred to as a solder interconnect 155 and may be, for example, a middle level interconnect (MLI) or a second level interconnect (SLI) that may couple the package 100 to a substrate 120. In embodiments, the substrate 120 may be a substrate of printed circuit board (PCB). In other embodiments, the substrate 120 may be, for example, a substrate of an interposer. In other embodiments, the substrate 120 may be another appropriate substrate. In some embodiments, the package 100 may be coupled with the substrate 120 via a socket (not shown) mounted on the substrate 120. In other embodiments, the package 100 may be surface mounted to the substrate 120.

As can be seen in FIG. 1, the die 110 and 125 may be generally vertically oriented with respect to one another in the package 100. To put it another way, the die 110 may be "above" or "on top of" the die 125 with respect to the substrate 120 in the orientation shown in FIG. 1. It will be understood that the specific arrangement depicted in FIG. 1 is only one example, and in other embodiments the die 110 and 125 may be at least partially laterally offset from their positions depicted in FIG. 1 such that the die 110 and 125 are not directly vertically aligned as depicted in FIG. 1. For example, in some embodiments die 110 and/or 125 may be to the left or right of their respective positions as depicted in FIG. 1. Additionally, rather than just a single die 110 or single die 125, in some embodiments die 110 and/or die 125 may include multiple die at a given layer instead of a single die.

In embodiments, solder balls 135 and 140 of the solder interconnect 155 may be generally coplanar with one another. As used herein, "coplanar" may refer to an arrangement wherein the solder balls 135 and 140 may be generally level with one another with respect to the package substrate 115 and the substrate 120. Because the solder balls 135 and 140 of the solder interconnect 155 are generally coplanar, the solder interconnect 155 may generally evenly connect with the substrate 120 when the package 100 is placed on the substrate 120. Specifically, a portion of the solder balls 135 and 140 that is farthest from the package substrate 115 may substantially evenly couple with the substrate 120 when the package 100 is placed on the substrate 120 as shown in FIG. 1.

The package substrate 115 may have one or more traces, vias, or other structures (not shown) that may carry signals between the die 110 and 125 through the package substrate 115, or between die 110 and solder balls 140. Specifically, the substrate through mold interconnects 145 may be configured to carry signals between the package substrate 115 and the solder balls 140. Similarly, the die through mold interconnects 150 may be configured to carry signals between the die 125 and the solder balls 135. As an example, a signal may pass from die 110 through one or more traces or vias in the package substrate 115 to substrate through mold interconnect 145, where it may then pass to solder ball 135 and from solder ball 135 to substrate 120 (or vice versa). Alternatively, a signal may pass from die 125 through die through mold interconnect 150 to solder ball 135, and from solder ball 135 to substrate 120 (or vice versa).

In some embodiments, the package 100 may optionally include an overmold 105 that may partially or wholly encapsulate die 110. In embodiments, the overmold 105 may be an epoxy material or some other electrically and/or thermally neutral material as described above with respect to mold 130.

Figure 2:
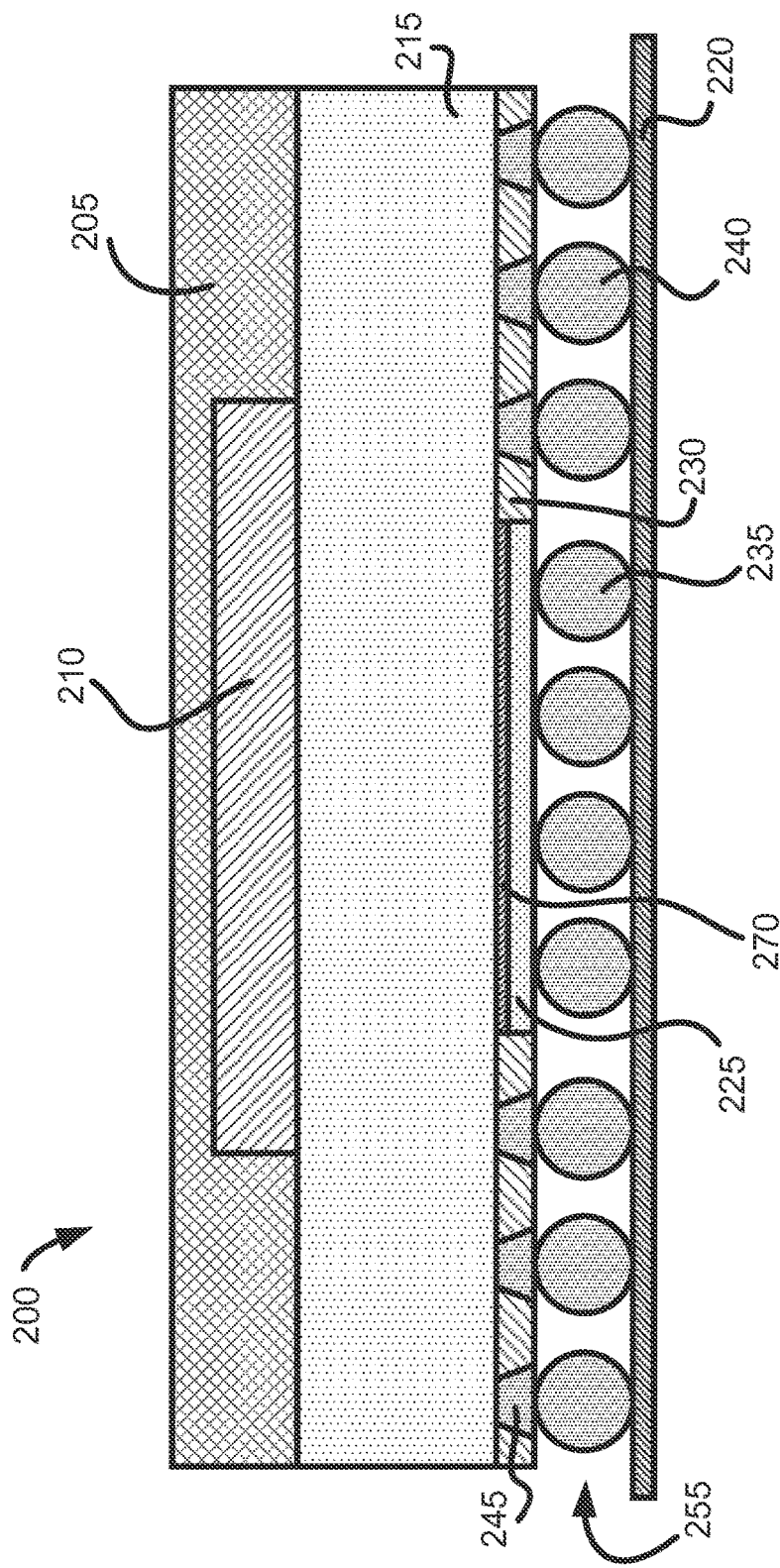
FIG. 2 is a simplified cross-sectional view of an alternative embodiment of a multi-die package, in accordance with various embodiments.

FIG. 2 depicts an alternative embodiment of a multi-die package 200. In embodiments, the multi-die package 200 may include a die 210 and a die 225, a package substrate 215, an overmold material 205, and an adhesive layer 270 that may be respectively similar to die 110, die 125, package substrate 115, overmold material 105, and adhesive layer 170. The package 200 may further include one or more substrate through mold interconnects 245 that may be similar to substrate through mold interconnects 145 of FIG. 1. In embodiments, the package 200 may further include a solder interconnect 255 that may include one or more solder balls 235 and 240, which may be respectively similar to solder interconnect 155, solder balls 135, and solder balls 140. As shown in FIG. 2, the diameters of solder balls 235 and 240 may be approximately equal.

The package 200 may further include a mold 230 that may be constructed of a material similar to that of mold 130. However, in the embodiment depicted in FIG. 2, the mold 230 may only partially encapsulate the die 225. Therefore, the mold 230 may only include a substrate through mold interconnect 245 between the package substrate 215 and the solder balls 240, which may be similar to the substrate through mold interconnect 145. The solder balls 235 of the solder interconnect 255 may couple directly to the die 225, or to pads of the die 225 (not shown).

Similarly to package 100 of FIG. 1, the die 210 and 225 may be generally vertically oriented with respect to one another in the package 200. To put it another way, the die 210 may be "above" or "on top of" the die 225 with respect to the substrate 220 in the orientation shown in FIG. 2. However, as described with respect to FIG. 1, in other embodiments one or both of die 210 or 225 may be laterally shifted (i.e., to the right or left of the image) from their position shown in FIG. 2.

Similarly to package 100, solder balls 235 and 240 of the solder interconnect 255 may be generally coplanar with one another. Because the solder balls 235 and 240 of the solder interconnect 255 are generally coplanar, the solder interconnect 255 may generally evenly connect with the substrate 220 when the package 200 is placed on the substrate 220. Specifically, a portion of the solder balls 235 and 240 that is farthest from the package substrate 215 may substantially evenly couple with the substrate 220 when the package 200 is placed on the substrate 220 as shown in FIG. 2.

As described above, the package substrate 215 may have one or more traces, vias, or other structures (not shown) that may carry signals between the die 210 and 225 through the package substrate 215, or between die 210 and solder balls 240. Specifically, the substrate through mold interconnects 245 may be configured to carry signals between the package substrate 215 and the solder balls 240. By contrast, the die 225 may be directly coupled to (for example, via one or more pads of the die 225) the solder balls 235. As an example, a signal may pass from die 210 through one or more traces or vias in the package substrate 215 to substrate through mold interconnect 245, where it may then pass to solder ball 235 and from solder ball 235 to substrate 220 (or vice versa). Alternatively, a signal may pass from die 225 directly to solder ball 235, and from solder ball 235 to substrate 220 (or vice versa).

It will be noted that in FIG. 1, the solder balls 140 and 135 are shown as integral with the through mold interconnects 145 and 150. By contrast, in FIG. 2, the solder balls 240 and 235 are shown as not integral with the die 225 or the substrate through mold interconnects 245. This difference is merely for the sake of illustration of different alternatives, and alternative embodiments of FIGS. 1, 2, or some other Figure herein may be depicted with some or all of the solder balls integrated or not integrated with the through mold interconnects, the die, and/or the package substrate.

Figure 3:
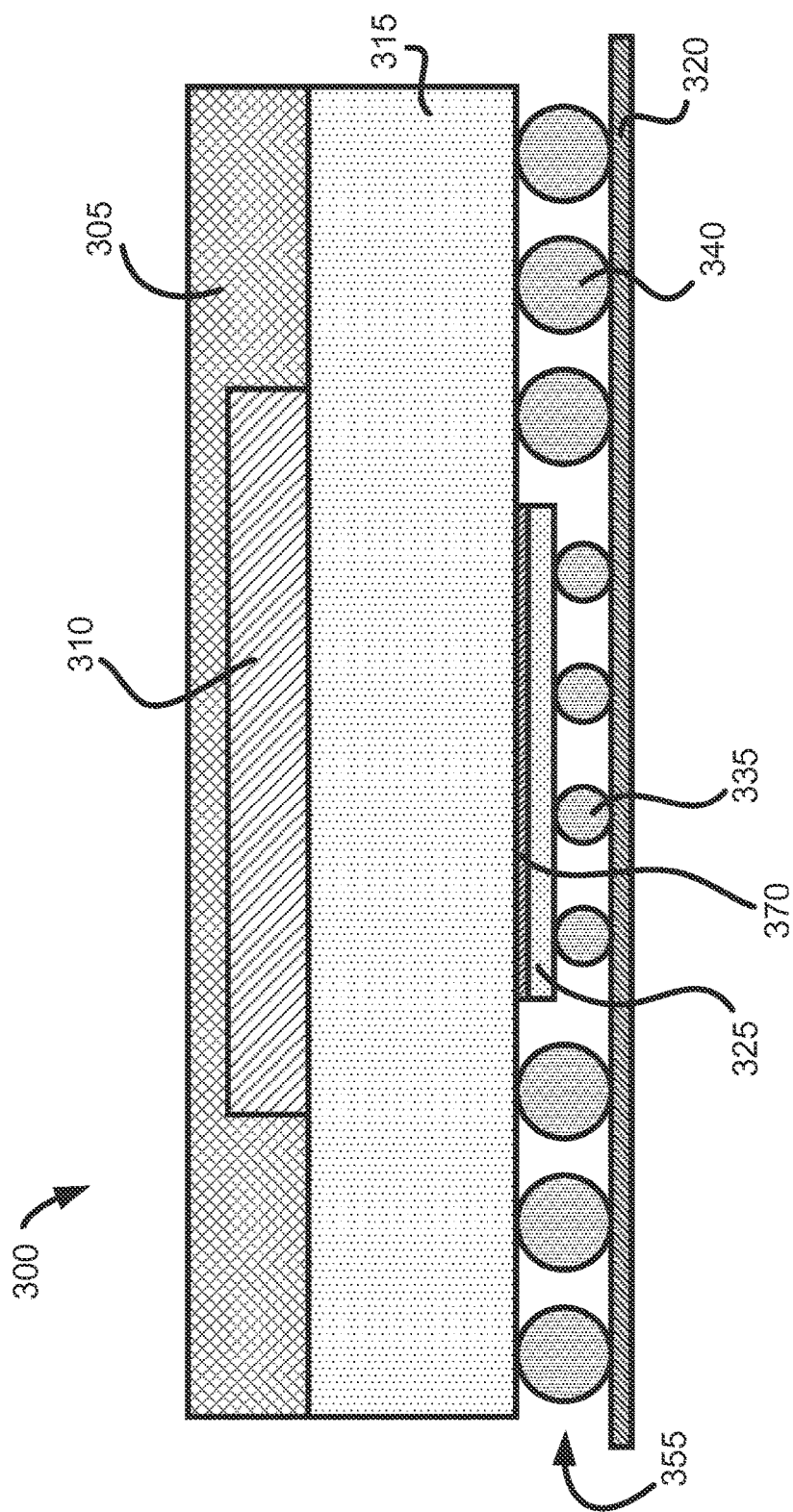
FIG. 3 is a simplified cross-sectional view of an alternative embodiment of a multi-die package, in accordance with various embodiments.

FIG. 3 depicts an alternative embodiment of a multi-die package 300. In embodiments, the multi-die package 300 may include a die 310 and a die 325, a package substrate 315, an overmold material 305, and an adhesive layer 370 that may be respectively similar to die 110, die 125, package substrate 115, overmold material 105, and adhesive layer 170.

In embodiments, the package 300 may further include a solder interconnect 355 that may include one or more solder balls 335 and 340. As shown in FIG. 3, the diameter of solder balls 340 may be greater than the diameter of solder balls 335. The solder balls 335 may be coupled directly to the die 325, for example, via one or more pads of the die 325 (not shown). Similarly, the solder balls 340 may be coupled directly to the package substrate 315, for example, via one or more pads of the package substrate 315 (not shown).

Similarly to package 300 of FIG. 3, the die 310 and 325 may be generally vertically oriented with respect to one another in the package 300. To put it another way, the die 310 may be "above" or "on top of" the die 325 with respect to the substrate 320 in the orientation shown in FIG. 3. However, as described with respect to FIG. 1, in other embodiments one or both of die 310 or 325 may be laterally shifted (i.e., to the right or left of the image) from their position shown in FIG. 3.

Similarly to package 100, solder balls 335 and 340 of the solder interconnect 355 may be generally coplanar with one another. Specifically, because solder balls 335 directly couple to the die 325 and solder balls 340 directly couple to the package substrate 315, the diameter of the solder balls 340 may be larger than the diameter of solder balls 335. This increased diameter may allow the solder balls 335 and 340 to be coplanar so that the points of the solder balls 340 and 335 that are farthest from the package substrate 315 may be generally horizontally level with one another as shown in FIG. 3. Because the solder balls 335 and 340 of the solder interconnect 355 are generally coplanar, the solder interconnect 355 may generally evenly connect with the substrate 320 when the package 300 is placed on the substrate 320.

Specifically, a portion of the solder balls 335 and 340 that is farthest from the package substrate 315 may substantially evenly couple with the substrate 320 when the package 300 is placed on the substrate 320 as shown in FIG. 3.

As described above, the package substrate 315 may have one or more traces, vias, or other structures (not shown) that may carry signals between the die 310 and 325 through the package substrate 315, or between die 310 and solder balls 340. As an example, a signal may pass from die 310 through one or more traces or vias in the package substrate 315 to solder ball 340, and from solder ball 340 to substrate 320 (or vice versa). Alternatively, a signal may pass from die 325 directly to solder ball 335, and from solder ball 335 to substrate 320 (or vice versa).

FIGS. 4-A through 4-C depict various stages of manufacturing a multi-die package such as packages 100, 200, or 300.

Initially, as shown in FIG. 4-A, a die 410 (which may be similar to die 110, 210, or 310) may be attached to a package substrate 415 (which may be similar to package substrate 115, 215, or 315). Next, as shown in FIG. 4-B, an overmold 405 (which may be similar to overmold 105, 205, or 305) may be attached to the package substrate 415 and the die 410 to wholly or partially encapsulate the die 410. Next, as shown in FIG. 4-C, the package substrate 415, overmold 405, and die 410 may be inverted, and a die 425 (which may be similar to die 125, 225, or 325) may be attached to the package substrate 415, for example, by an adhesive layer 470 (which may be similar to adhesive layer 170, 270, or 370). For example, the die 425 may be attached to the package substrate 415 on a side of the package substrate opposite the die 410.

FIGS. 5-A through 5-C depict various stages of manufacturing a multi-die package such as package 100. Specifically, the stage depicted in FIG. 5-A may be manufactured subsequent to the stage depicted in FIG. 4-C. The stage depicted in FIG. 5-A may include a die 525, package substrate 515, overmold 505, adhesive layer 570, and die 510 which may be respectively similar to die 425, package substrate 415, overmold 405, adhesive layer 470, and die 410. A mold 530 (which may be similar to mold 130) may be applied to the die 525 and the package substrate 515 to encapsulate the die 525. Specifically, the mold 530 may be applied by transfer molding. For example, in some embodiments, the mold 530 may be applied by compression or transfer molding an epoxy resin formulation over a matrix of substrates in a strip format.

Subsequently, as depicted in FIG. 5-B, one or more substrate through mold interconnects 545 (which may be similar to substrate through mold interconnects 145) and die through mold interconnects 550 (which may be similar to die through mold interconnects 150) may be formed in the mold 530. Specifically, the through mold interconnects 545 and 550 may be formed by laser ablation, cleaning, and solder paste deposition and reflow. For example, in some embodiments the process may include an ablation process using a laser based drilling tool, followed by a solder or alternative conductive material filling process to make an electrical connection through the interconnects 545 and 550.

Finally, as depicted in FIG. 5-C, a multi-die package 500 (which may be similar to multi-die package 100) may be formed by coupling one or more solder balls 540 and 535 (which may be similar to solder balls 140 and 135) to the through mold interconnects 545 and 550. Specifically, the solder balls 540 and 535 may be coupled to the through mold interconnects 545 and 550 by a solder reflow process that may include depositing flux and solder balls on the through mold interconnects 545 and 550 and heating the materials to reflow and join the solder balls 540 and 535 to the through mold interconnects 545 and 550. Generally, the solder reflow process may be similar to that typically used to connect two metal surfaces using solder as the connecting medium. The surfaces may be a bare metal like copper (Cu), nickel (Ni), gold (Au), or some other material that can react with the solder. During the connection process a fluxing material may be used to reduce any metal oxides that are present on the metal or solder surfaces. The reflow process may be performed at a high enough temperature for the solder to melt and react with the metal surface.

FIGS. 6-A through 6-C depict various stages of manufacturing a multi-die package such as package 200. Specifically, the stage depicted in FIG. 6-A may be manufactured subsequent to the stage depicted in FIG. 4-C. The stage depicted in FIG. 6-A may include a die 625, package substrate 615, overmold 605, adhesive layer 670, and die 610 which may be respectively similar to die 425, package substrate 415, overmold 405, adhesive layer 470, and die 410. A mold 630 (which may be similar to mold 230) may be applied to the die 625 and the package substrate 615 to at least partially encapsulate the die 625. Specifically, the mold 630 may be applied in a manner similar to that described above for mold 530. In the embodiments depicted in FIG. 6-A, the mold 630 may only cover the sides of the die 625 (i.e., the portions of the die perpendicular to the package substrate 615), while leaving the face of the die 625 (i.e., the portion of the die 625 that is opposite the portion of the die 625 coupled with the package substrate 615 via adhesive layer 670) substantially free of the mold 630 as depicted in FIG. 6-A.

Subsequently, as depicted in FIG. 6-B, one or more substrate through mold interconnects 645 (which may be similar to substrate through mold interconnects 245) may be formed in the mold 630. Specifically, the substrate through mold interconnects 645 may be formed in accordance with the processes or techniques described above with respect to substrate through mold interconnects 545.

Finally, as depicted in FIG. 6-C, a multi-die package 600 (which may be similar to multi-die package 200) may be formed by coupling one or more solder balls 640 (which may be similar to solder balls 240) to the substrate through mold interconnects 645. Further, one or more solder balls 635 (which may be similar to solder balls 235) may be coupled directly to the die 625 as shown in FIG. 6-C. Specifically, as described above, the solder balls 635 may be coupled to one or more pads of the die 625 (not shown for the sake of clarity). Specifically, the one or more solder balls 640 may be coupled to the substrate through mold interconnects 645 in accordance with the processes or techniques described above with respect to solder balls 540 and substrate through mold interconnects 545. The solder balls 635 may be coupled to the die 625 (or pads thereof) by depositing flux and solder balls and heating to reflow and join the solder balls 635 to the die 625. In a specific example, solder paste or a solder sphere may be placed on a metal pad on the die 635. A fluxing material on the metal pad 635 may ensure that a quality solder joint is formed between the solder ball 635 and the pad on the die 625 during the reflow process.

FIGS. 7-A and 7-B depict various stages of manufacturing a multi-die package such as package 300. Specifically, the stage depicted in FIG. 7-A may be manufactured subsequent to the stage depicted in FIG. 4-C. The stage depicted in FIG. 7-A may include a die 725, package substrate 715, overmold 705, adhesive layer 770, and die 710 which may be respectively similar to die 425, package substrate 415, overmold 405, adhesive layer 470, and die 410. One or more solder balls 735 (which may be similar to solder balls 335) may be coupled with the die 725 as shown in FIG. 7-A. Specifically, as described above, the solder balls 735 may be coupled to one or more pads of the die 725 (not shown for the sake of clarity).

Subsequently, as shown in FIG. 7-B, one or more solder balls 740 (which may be similar to solder balls 340) may be coupled to the package substrate 715. Specifically, the solder balls 740 may be coupled with a pad, trace, via, or some other circuitry in or on the package substrate 715 to form a multi-die package 700 (which may be similar to multi-die package 300).

The multi-die packages 100, 200, or 300 may provide significant benefits over legacy multi-die packages. For example, by having the first and second dies generally vertically arranged on the package (i.e., one "on top" of the other) rather than laterally arranged (i.e., "side by side"), the footprint of the overall package may be reduced. This reduction in footprint of the multi-chip die may allow for a smaller form factor of a device using such a multi-chip die.

Further, by facing the active side of the die such as die 125, 225, or 325 away from the package substrate so that it may couple with solder balls 135, 235, or 335, the cost of manufacturing such a multi-die package may be reduced. Specifically, in legacy devices the active surface of the die may have been arranged to face the package substrate. In these legacy packages, the connections of the die (e.g., die 125, 225, or 325) would then have to be routed through the package substrate, rather than being connectable via solder balls 135/235/335. Such a routing through the package substrate could add complexity, and therefore cost, to the legacy packages which are reduced in embodiments herein.

Figure 8:
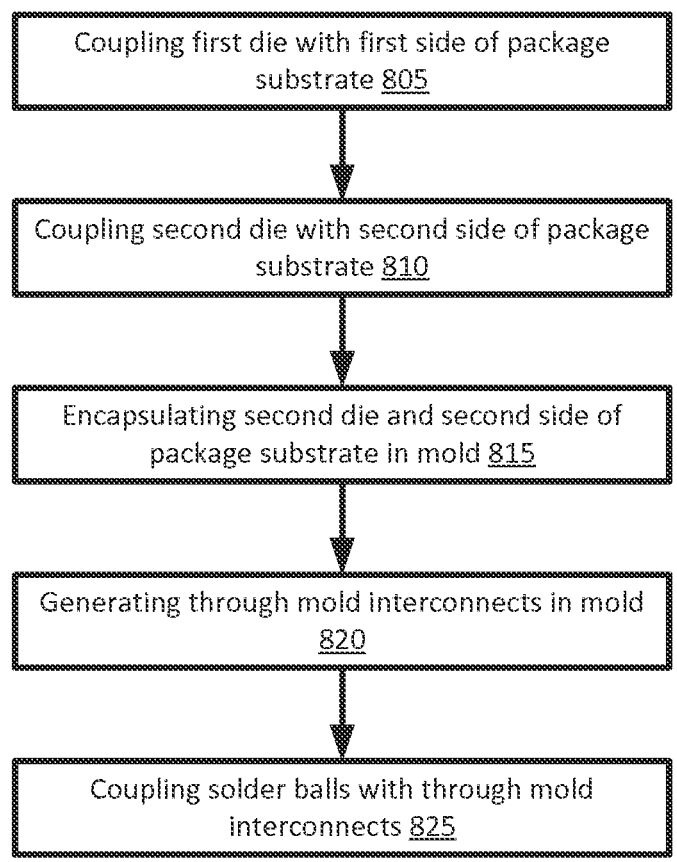
FIG. 8 is an example process flowchart for generating a multi-die package such as the multi-die package of FIG. 1.

FIG. 8 is an example process flowchart for generating a multi-die package such as the multi-die package 100 of FIG. 1.

The process 800 may include coupling a first die such as die 110 with the first side of a package substrate such as package substrate 115 at 805. The process 800 may then include coupling a second die such as die 125 with the package substrate at 810. The process 800 may then include encapsulating the second die and the second side of the package substrate in a mold such as mold 130 at 815.

The process 800 may then include generating through mold interconnects such as substrate through mold interconnects 145 and die through mold interconnects 150 at 820. The process may then include coupling solder balls such as solder balls 140 and 135 to the through mold interconnects at 825.

Figure 9:
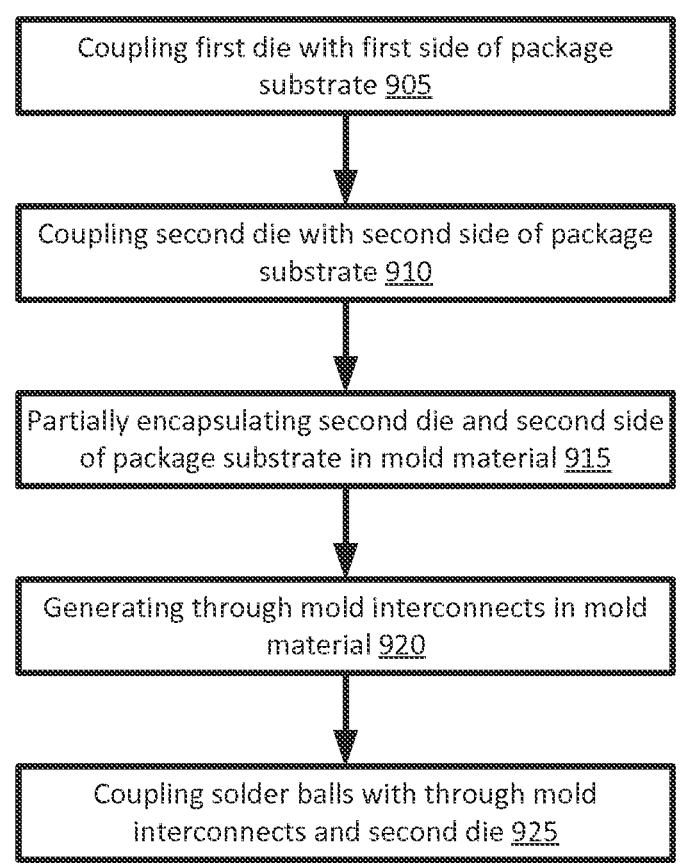
FIG. 9 is an example process flowchart for generating a multi-die package such as the multi-die package of FIG. 2.

FIG. 9 is an example process flowchart for generating a multi-die package such as the multi-die package 200 of FIG. 2.

The process 900 may include coupling a first die such as die 210 with the first side of a package substrate such as package substrate 215 at 905. The process 900 may then include coupling a second die such as die 225 with the package substrate at 910. The process 900 may then include at least partially encapsulating the second die and the second side of the package substrate in a mold such as mold 230 at 915.

The process 900 may then include generating through mold interconnects such as substrate through mold interconnects 245 at 920. The process may then include coupling solder balls such as solder balls 240 to the through mold interconnects and solder balls such as solder balls 235 to the second die 225 at 925.

Figure 10:
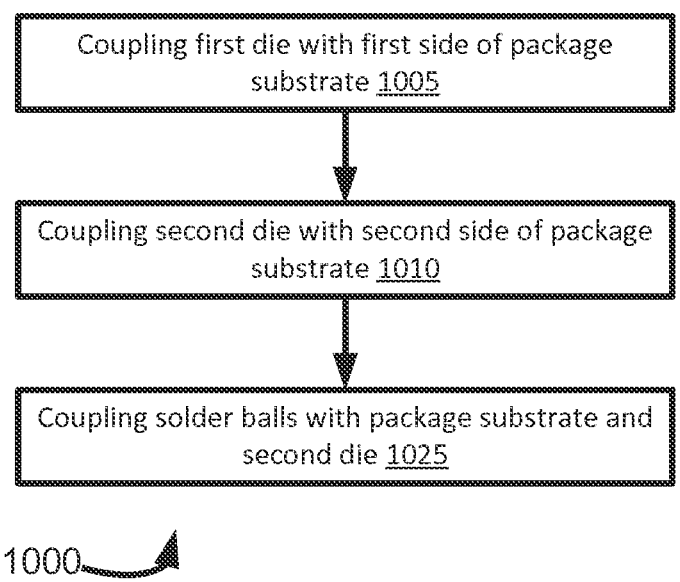
FIG. 10 is an example process flowchart for generating a multi-die package such as the multi-die package of FIG. 3.

FIG. 10 is an example process flowchart for generating a multi-die package such as the multi-die package 300 of FIG. 3.

The process 1000 may include coupling a first die such as die 310 with the first side of a package substrate such as package substrate 315 at 1005. The process 1000 may then include coupling a second die such as die 325 with the package substrate at 1010. The process may then include coupling solder balls such as solder balls 335 to the second die and solder balls such as solder balls 340 to the package substrate at 1025.

The depicted processes 800, 900, and 1000 are not intended to be inclusive of every element of FIGS. 1-3, and other detailed embodiments may include the placement of elements such as the overmold 105/205 and/or the use of the adhesive layers 170/270/370. Rather, the depicted processes 800, 900, and 1000 may provide a general framework for construction of the multi-die packages 100, 200, and/or 300.

Figure 11:
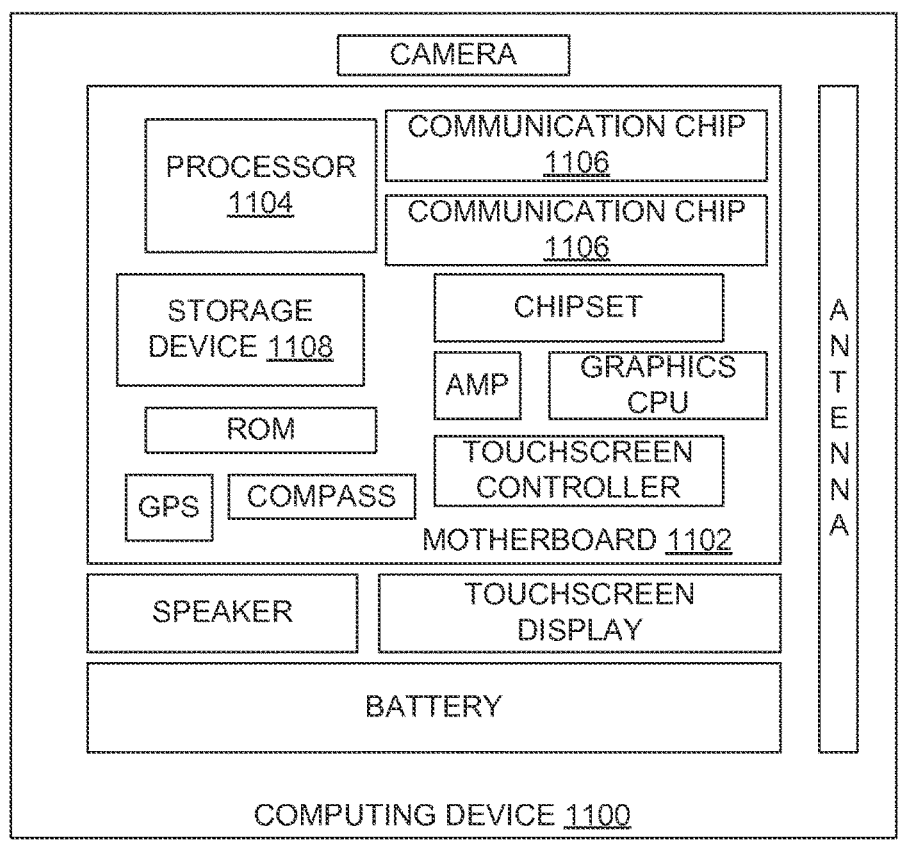
FIG. 11 is an example computing device that may include the package of FIGS. 1-3, in accordance with various embodiments.

Embodiments of the present disclosure may be implemented into a system using the packages and manufacturing techniques disclosed herein. FIG. 11 schematically illustrates a computing device 1100, in accordance with some implementations, which may include one or more multi-die packages such as multi-die packages 100, 200, or 300.

The computing device 1100 may be, for example, a mobile communication device or a desktop or rack-based computing device. The computing device 1100 may house a board such as a motherboard 1102. The motherboard 1102 may include a number of components, including (but not limited to) a processor 1104 and at least one communication chip 1106. Any of the components discussed herein with reference to the computing device 1100 may be arranged in or coupled with a multi-die package such as multi-die package 100, 200, or 300. In further implementations, the communication chip 1106 may be part of a multi-die package such as multi-die package 100, 200, or 300.

The computing device 1100 may include a storage device 1108. In some embodiments, the storage device 1108 may include one or more solid state drives. Examples of storage devices that may be included in the storage device 1108 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1100 may include other components that may or may not be physically and electrically coupled to the motherboard 1102. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1106 and the antenna may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communications (GSM), General Packet Radio Service (CPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as Wi-Fi and Bluetooth, and a second communication chip 1106 may be dedicated to longer range wireless communications such as GPS, EDGE, GPRS, CDMA, WiMAX, LTE, EV-DO, and others. In some embodiments, the communication chip 1106 may support wired communications. For example, the computing device 1100 may include one or more wired servers.

The processor 1104 and/or the communication chip 1106 of the computing device 1100 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a package comprising: a package substrate with a first side and a second side opposite the first side; a first die coupled with the first side of the package substrate; a second die with a first side and a second side opposite the first side, wherein the first side of the second die is coupled with the second side of the package substrate; a first solder ball with a first side and a second side opposite the first side, wherein the first side of the first solder ball is coupled with the second side of the package substrate; and a second solder ball with a first side and a second side opposite the first side, wherein the first side of the second solder ball is coupled with the second side of the second die, and the second side of the first and second solder balls are approximately coplanar.

Example 2 may include the package of example 1, wherein a diameter of the first solder ball is greater than a diameter of the second solder ball.

Example 3 may include the package of example 1, wherein a diameter of the first solder ball is approximately equal to a diameter of the second solder ball.

Example 4 may include the package of example 1, further comprising a mold material coupled with the second side of the package substrate such that the mold material at least partially encapsulates the second die.

Example 5 may include the package of example 4, further comprising a conductive through mold interconnect material in the mold material, wherein the conductive through mold interconnect material is coupled to the first side of the first solder ball and the second side of the package substrate.

Example 6 may include the package of example 4, wherein the mold material fully encapsulates the second die.

Example 7 may include the package of any of examples 1-6, wherein the second die is coupled with the package substrate via an adhesive layer positioned between the second die and the package substrate.

Example 8 may include the package of any of examples 1-6, wherein the first die or the second die are a processor or a memory.

Example 9 may include a method comprising: coupling a first die to a second side of a substrate that includes a first side and the second side opposite the first side; coupling, via an adhesive layer, the second side of the substrate and a first side of a second die that includes a first side and a second side opposite the first side; coupling a first solder ball to the second side of the substrate; and coupling a second solder ball to the second side of the second die such that a point of the first solder ball that is farthest from the first die is approximately coplanar with a point of the second solder ball that is farthest from the first die.

Example 10 may include the method of example 9, wherein a diameter of the first solder ball is approximately equal to a diameter of the second solder ball.

Example 11 may include the method of example 9, wherein a diameter of the first solder ball is greater than a diameter of the second solder ball.

Example 12 may include the method of any of examples 9-11, further comprising depositing, subsequent to the coupling of the second die to the substrate, a mold material on the second side of the substrate such that the mold material at least partially encapsulates the second die.

Example 13 may include the method of example 12, further comprising: generating a via in the mold material to expose the second side of the substrate in the via; depositing a conductive through interconnect material in the via such that the conductive through interconnect material is directly coupled with the second side of the substrate; and coupling the first solder ball to the second side of the substrate by directly coupling the first solder ball to the conductive through interconnect material.

Example 14 may include the method of example 13, wherein the mold material encapsulates the second side of the second die.

Example 15 may include the method of example 14, further comprising: generating a via in the mold material to expose the second side of the second die in the via; depositing a conductive through interconnect material in the via such that the conductive through interconnect material is directly coupled with the second side of the second die; and coupling the second solder ball to the second side of the second die by directly coupling the second solder ball to the conductive through interconnect material.

Example 16 may include an electronic device comprising: a printed circuit board (PCB); a package coupled with the PCB, the package comprising: a package substrate with a first side and a second side opposite the first side; a first die coupled with the first side of the package substrate; a second die with a first side and a second side opposite the first side, wherein the first side of the second die is coupled with the second side of the package substrate; a first solder ball coupled with the second side of the package substrate; and a second solder ball coupled with the second side of the second die such that a point of the first solder ball farthest from the package substrate is approximately coplanar with a point of the second solder ball farthest from the package substrate.

Example 17 may include the electronic device of example 16, further comprising a mold material coupled with the second side of the package substrate such that the mold material at least partially encapsulates the second die.

Example 18 may include the electronic device of example 17, further comprising a conductive through mold interconnect material in the mold material, wherein the conductive through mold interconnect material is coupled to a first side of the first solder ball and the second side of the package substrate.

Example 19 may include the electronic device of example 17, wherein the mold is material fully encapsulates the second die.

Example 20 may include the electronic device of any of examples 16-19, wherein the second die is coupled with the package substrate via an adhesive layer positioned between the second die and the package substrate.

What is claimed is:

1. An apparatus comprising:
a package including:
a package substrate with a first side and a second side opposite the first side;
a first die coupled with the first side of the package substrate;
a second die with a first side and a second side opposite the first side, wherein the first side of the second die is coupled with the second side of the package substrate;
a first solder ball with a first side and a second side opposite the first side, wherein the first side of the first solder ball is coupled with the second side of the package substrate;
a second solder ball with a first side and a second side opposite the first side, wherein the first side of the second solder ball is coupled with the second side of the second die, and wherein the second sides of the first and second solder balls are approximately coplanar; and
a mold material having a first side and a second side opposite the first side, wherein the first side of the mold material is coupled with the second side of the package substrate, wherein the mold material at least partially encapsulates the second die, and wherein the first and second solder balls extend beyond the second side of the mold material; and
a substrate having a first side and a second side, wherein the first side of the substrate is coupled with the coplanar second sides of the first and second solder balls, to form a space between the second side of the mold material and the first side of the substrate, wherein the formed space is free from substrate or mold layers.

2. The package of claim 1, wherein a diameter of the first solder ball is greater than a diameter of the second solder ball.

3. The package of claim 1, wherein a diameter of the first solder ball is approximately equal to a diameter of the second solder ball.

4. The package of claim 1, further comprising a conductive through mold interconnect material in the mold material, wherein the conductive through mold interconnect material is coupled to the first side of the first solder ball and the second side of the package substrate.

5. The package of claim 1, wherein the mold material fully encapsulates the second die.

6. The package of claim 1, wherein the second die is coupled with the package substrate via an adhesive layer positioned between the second die and the package substrate.

7. The package of claim 1, wherein the first die or the second die are a processor or a memory.

8. A method comprising:
coupling a first die to a first side of a package substrate that includes a first side and the second side opposite the first side;
coupling, via an adhesive layer, the second side of the package substrate and a first side of a second die that includes a first side and a second side opposite the first side;
coupling a first solder ball to the second side of the package substrate;
coupling a second solder ball to the second side of the second die such that a point of the first solder ball that is farthest from the first die is approximately coplanar with a point of the second solder ball that is farthest from the first die;
disposing a mold material having a first side and a second side opposite the first side, including coupling the first side of the mold material with the second side of the package substrate, to at least partially encapsulate the second die, keeping the first and second balls extending beyond the second side of the mold material; and
disposing a substrate having a first side and a second side, including coupling the first side of the substrate with the coplanar second sides of the first and second solder balls, to form a space between the second side of the mold material and the first side of the substrate, wherein the formed space is free from substrate or mold layers.

9. The method of claim 8, wherein a diameter of the first solder ball is approximately equal to a diameter of the second solder ball.

10. The method of claim 8, wherein a diameter of the first solder ball is greater than a diameter of the second solder ball.

11. The method of claim 8, further comprising:
generating a via in the mold material to expose the second side of the package substrate in the via;

depositing a conductive through interconnect material in the via such that the conductive through interconnect material is directly coupled with the second side of the package substrate; and coupling the first solder ball to the second side of the package substrate by directly coupling the first solder ball to the conductive through interconnect material.

12. The method of claim 11, wherein the mold material encapsulates the second side of the second die.

13. The method of claim 12, further comprising:

generating a via in the mold material to expose the second side of the second die in the via;

depositing a conductive through interconnect material in the via such that the conductive through interconnect material is directly coupled with the second side of the second die; and coupling the second solder ball to the second side of the second die by directly coupling the second solder ball to the conductive through interconnect material.

14. An electronic device comprising:

a printed circuit board (PCB);

a package coupled with the PCB, the package comprising:

a package substrate with a first side and a second side opposite the first side;

a first die coupled with the first side of the package substrate;

a second die with a first side and a second side opposite the first side, wherein the first side of the second die is coupled with the second side of the package substrate;

a first solder ball coupled with the second side of the package substrate;

a second solder ball coupled with the second side of the second die such that a point of the first solder ball farthest from the package substrate is approximately coplanar with a point of the second solder ball farthest from the package substrate; and a mold material having a first side and a second side opposite the first side, wherein the first side of the mold material is coupled with the second side of the package substrate, wherein the mold material at least partially encapsulates the second die, and wherein the first and second solder balls extend beyond the second side of the mold material, wherein the PCB includes a substrate having a first side and a second side, wherein the first side of the substrate is coupled with the coplanar second sides of the first and second solder balls, to form a space between the second side of the mold material and the first side of the substrate, wherein the formed space is free from substrate or mold layers.

15. The electronic device of claim 14, further comprising a conductive through mold interconnect material in the mold material, wherein the conductive through mold interconnect material is coupled to a first side of the first solder ball and the second side of the package substrate.

16. The electronic device of claim 14, wherein the mold material fully encapsulates the second die.

17. The electronic device of claim 14, wherein the second die is coupled with the package substrate via an adhesive layer positioned between the second die and the package substrate.

* * * * *